(12) United States Patent
Tonthat et al.

(10) Patent No.: US 9,370,119 B2
(45) Date of Patent: Jun. 14, 2016

(54) SLIDING RACK-MOUNTABLE RAILS FOR RACK-MOUNTABLE COMPONENTS

(71) Applicant: Innovation First, Inc., Greenville, TX (US)

(72) Inventors: Hoainam James Tonthat, Greenville, TX (US); Robert H. Mimlitch, III, Rowlett, TX (US); Juan Carlos Valles, Forney, TX (US); James Whitney Wilson, Nevada, TX (US)

(73) Assignee: Innovation First, Inc., Greenville, TX (US)

( * ) Notice: Subject to any disclaimer, the term of this patent is extended or adjusted under 35 U.S.C. 154(b) by 29 days.

(21) Appl. No.: 14/037,574

(22) Filed: Sep. 26, 2013

(65) Prior Publication Data

US 2015/0084494 A1    Mar. 26, 2015

(51) Int. Cl.
*H05K 7/14* (2006.01)
*A47B 88/04* (2006.01)
*H05K 7/18* (2006.01)

(52) U.S. Cl.
CPC ............ *H05K 7/1489* (2013.01); *A47B 88/044* (2013.01); *H05K 7/1421* (2013.01); *H05K 7/183* (2013.01)

(58) Field of Classification Search
CPC ............... A47B 88/044; A47B 2210/0032; A47B 2210/0056; A47B 2210/0059; A47B 88/0085; A47B 88/16; H05K 7/1421; H05K 7/183; H05K 5/0217; H05K 7/1489
USPC .......... 312/333, 334.1, 334.5, 334.4; 211/26, 211/192; 248/224.51, 224.61; 361/679.37–679.39, 724–727; 292/216
See application file for complete search history.

(56) References Cited

U.S. PATENT DOCUMENTS

| | | | | |
|---|---|---|---|---|
| 6,442,909 | B2 * | 9/2002 | Waalkes et al. | 52/239 |
| 6,622,873 | B2 * | 9/2003 | Hegrenes et al. | 211/26 |
| 6,655,534 | B2 * | 12/2003 | Williams et al. | 211/26 |
| 7,494,101 | B2 * | 2/2009 | Chen | 248/298.1 |
| 8,146,756 | B2 * | 4/2012 | Brock et al. | 211/192 |
| 2005/0206285 | A1 * | 9/2005 | Greenwald et al. | 312/334.5 |
| 2006/0283816 | A1 * | 12/2006 | Moore et al. | 211/26 |
| 2012/0292274 | A1 * | 11/2012 | Lin et al. | 211/86.01 |
| 2012/0292928 | A1 * | 11/2012 | Chang et al. | 292/273 |
| 2014/0132139 | A1 * | 5/2014 | Chang | 312/333 |
| 2015/0048227 | A1 * | 2/2015 | Chuang | 248/228.4 |

* cited by examiner

*Primary Examiner* — Daniel J Troy
*Assistant Examiner* — Ryan A Doyle
(74) *Attorney, Agent, or Firm* — Adam K. Sacharoff; Much Shelist

(57) ABSTRACT

A support rail assembly for supporting a load in a computer rack system in accordance with one embodiment of the present invention includes a pair of rails configured to be secured to sides of computer equipment and secured to the rack system such that the computer equipment may slide into and out of the rack system. Each rail includes an inner rail slideably engaging an outer rail. The inner rail being secured to the sides of the computer equipment and the outer rail being secured to the front and rear racks. The outer rail having rear end and front end bracket that attach to the racks. Unique front end locking flanges and rear end locking flanges with rear end piloting flanges allow the outer rails to quickly pivot and lock into position.

30 Claims, 19 Drawing Sheets

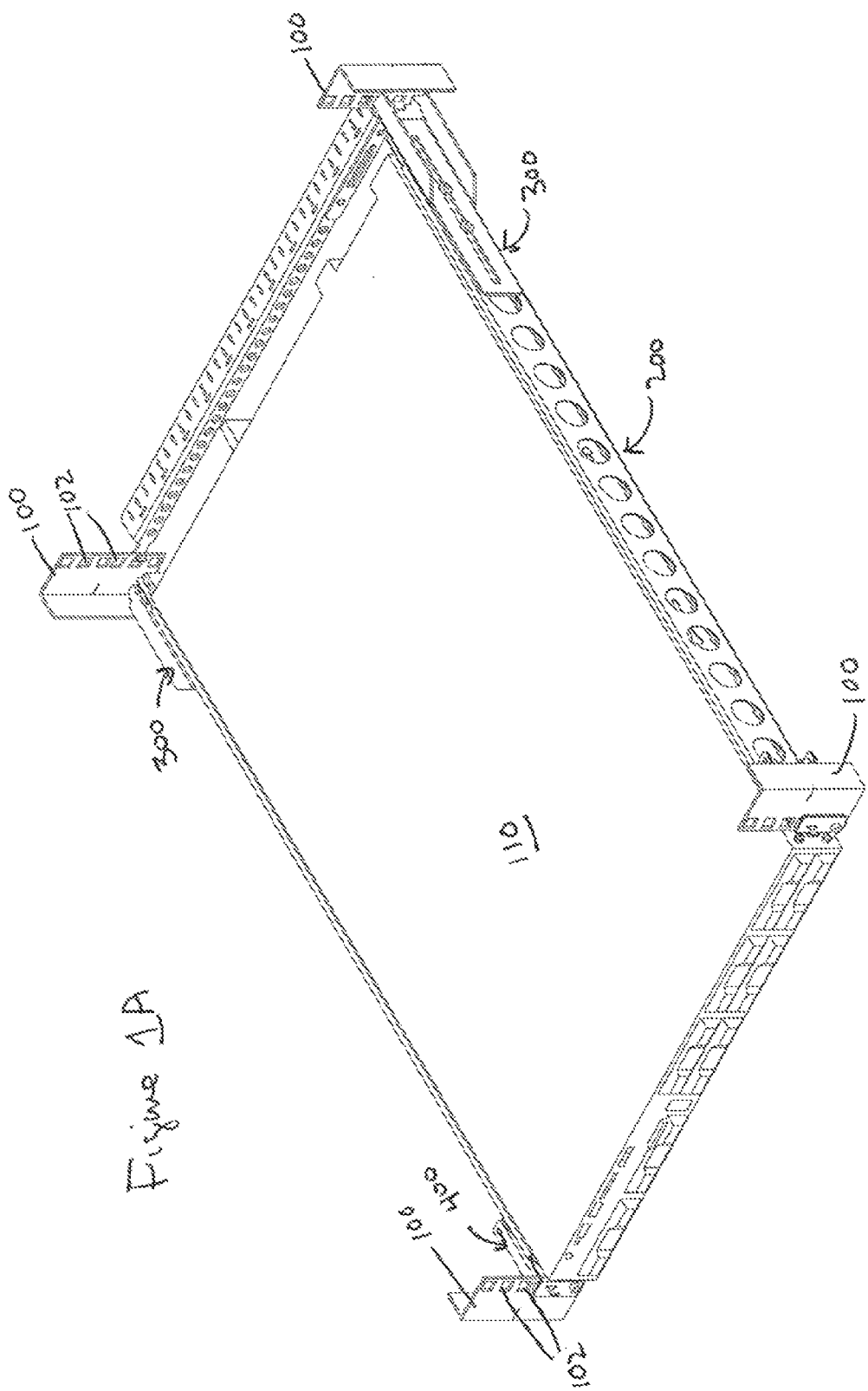

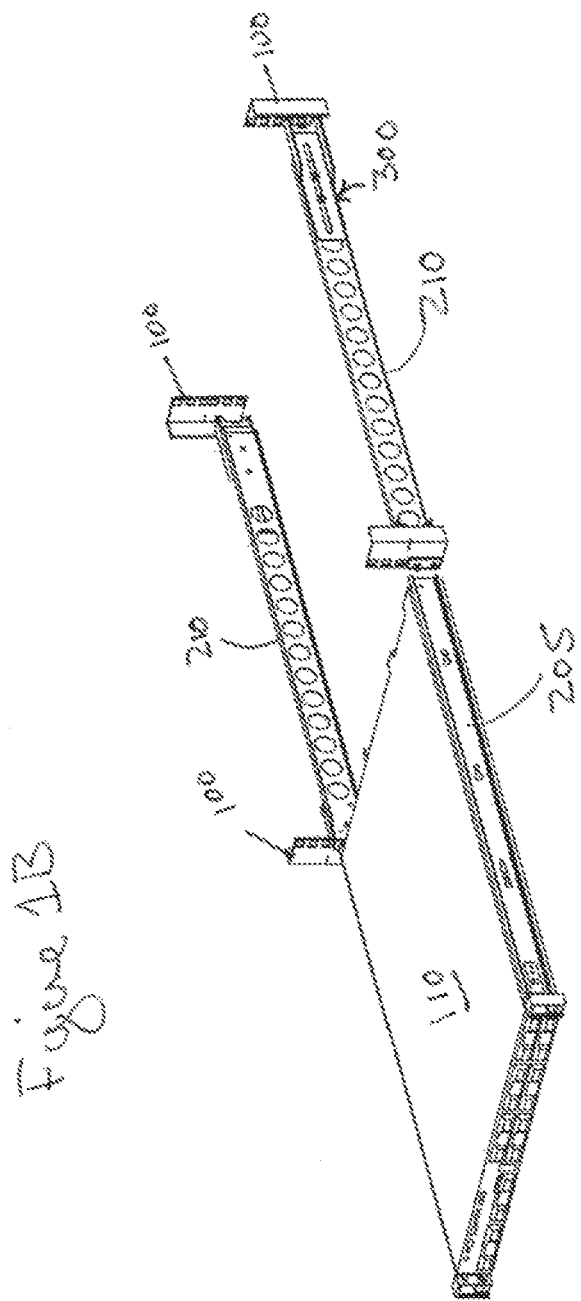

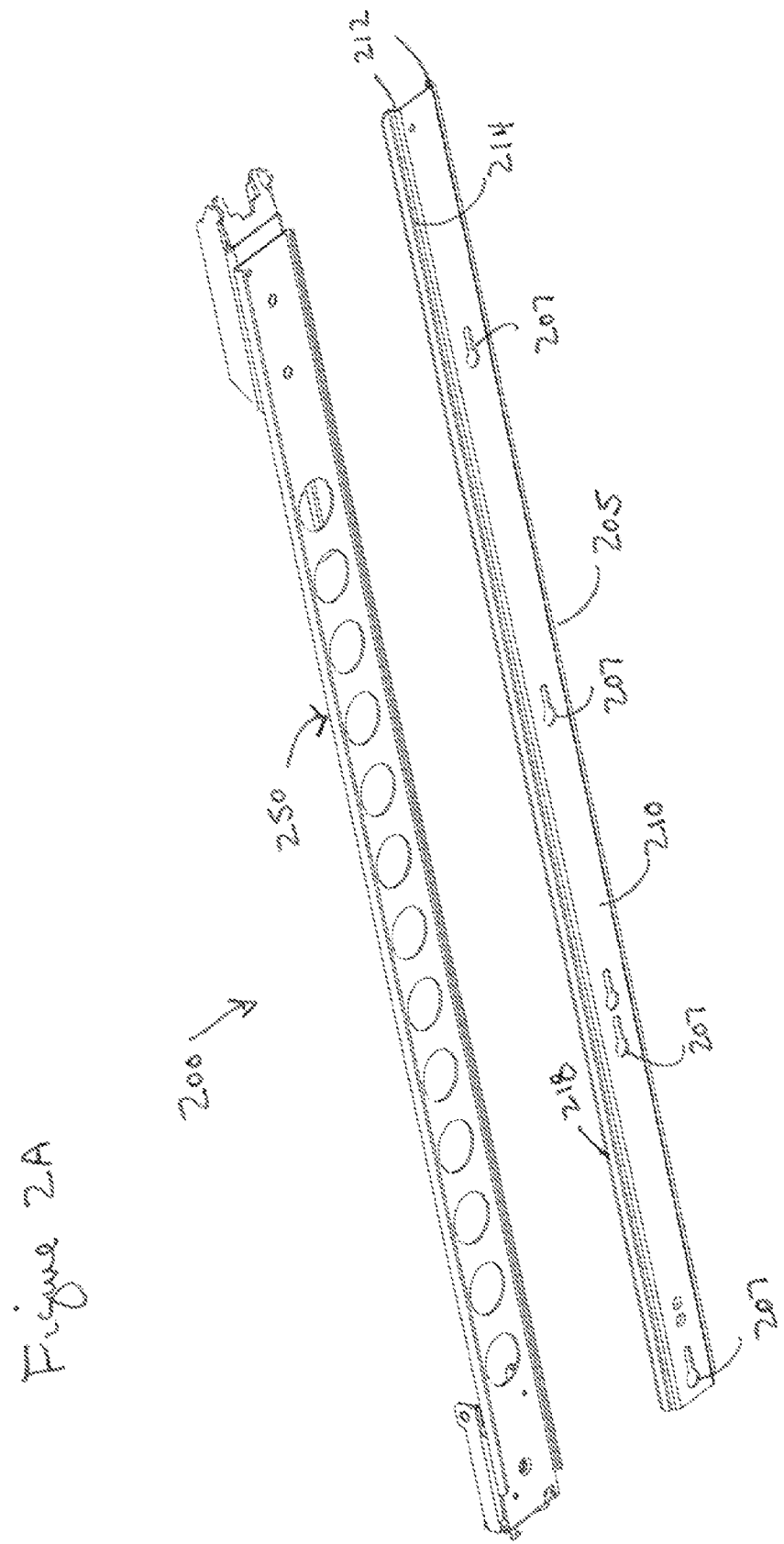

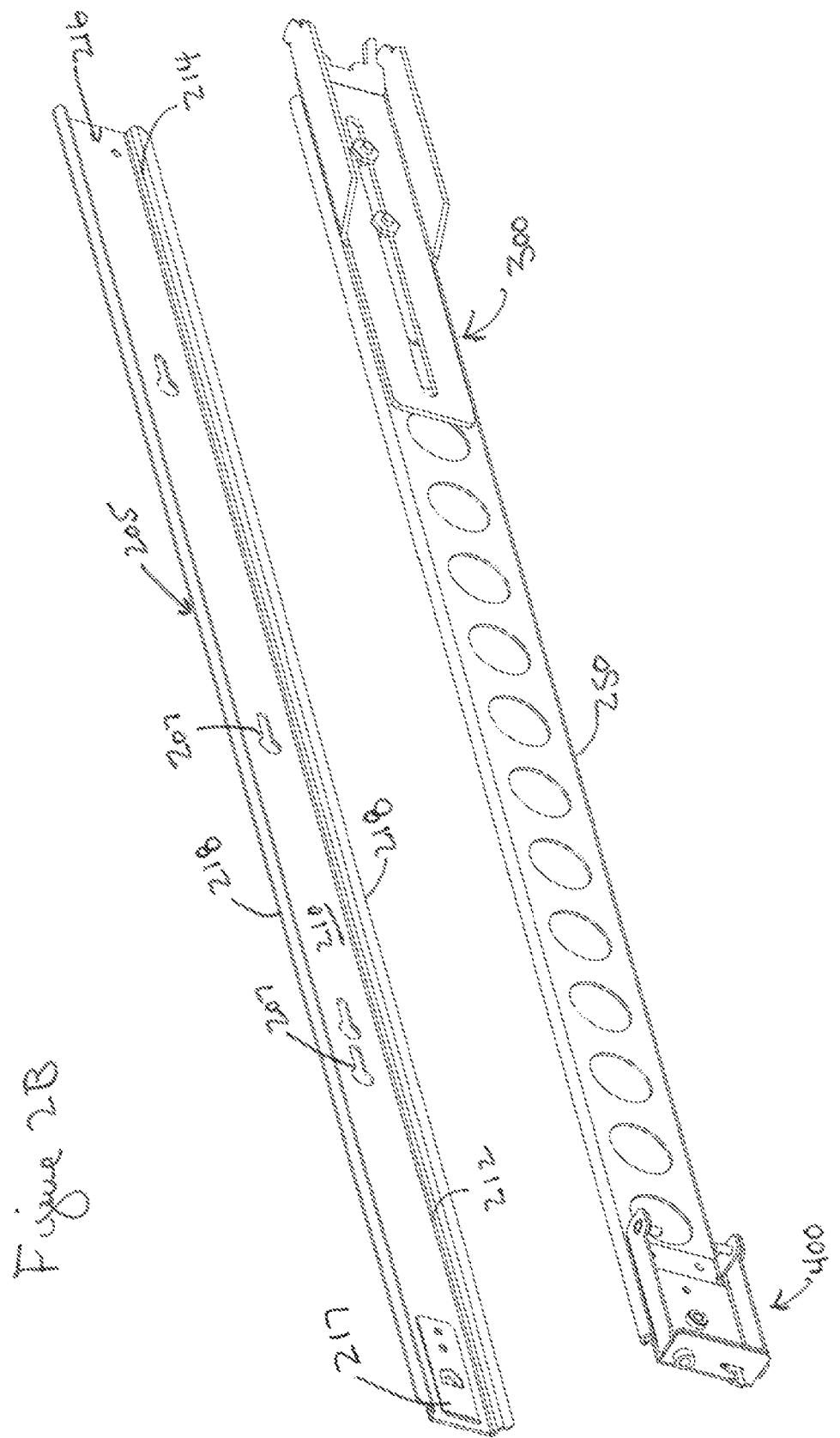

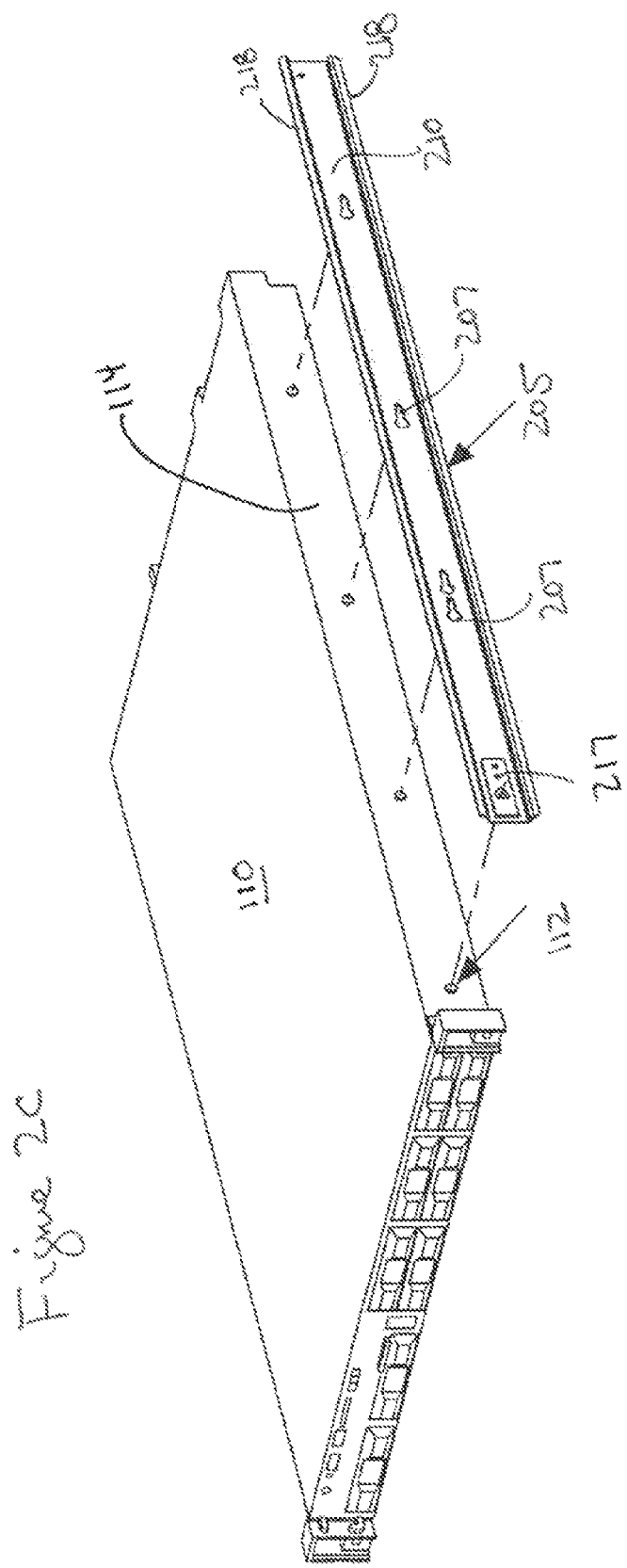

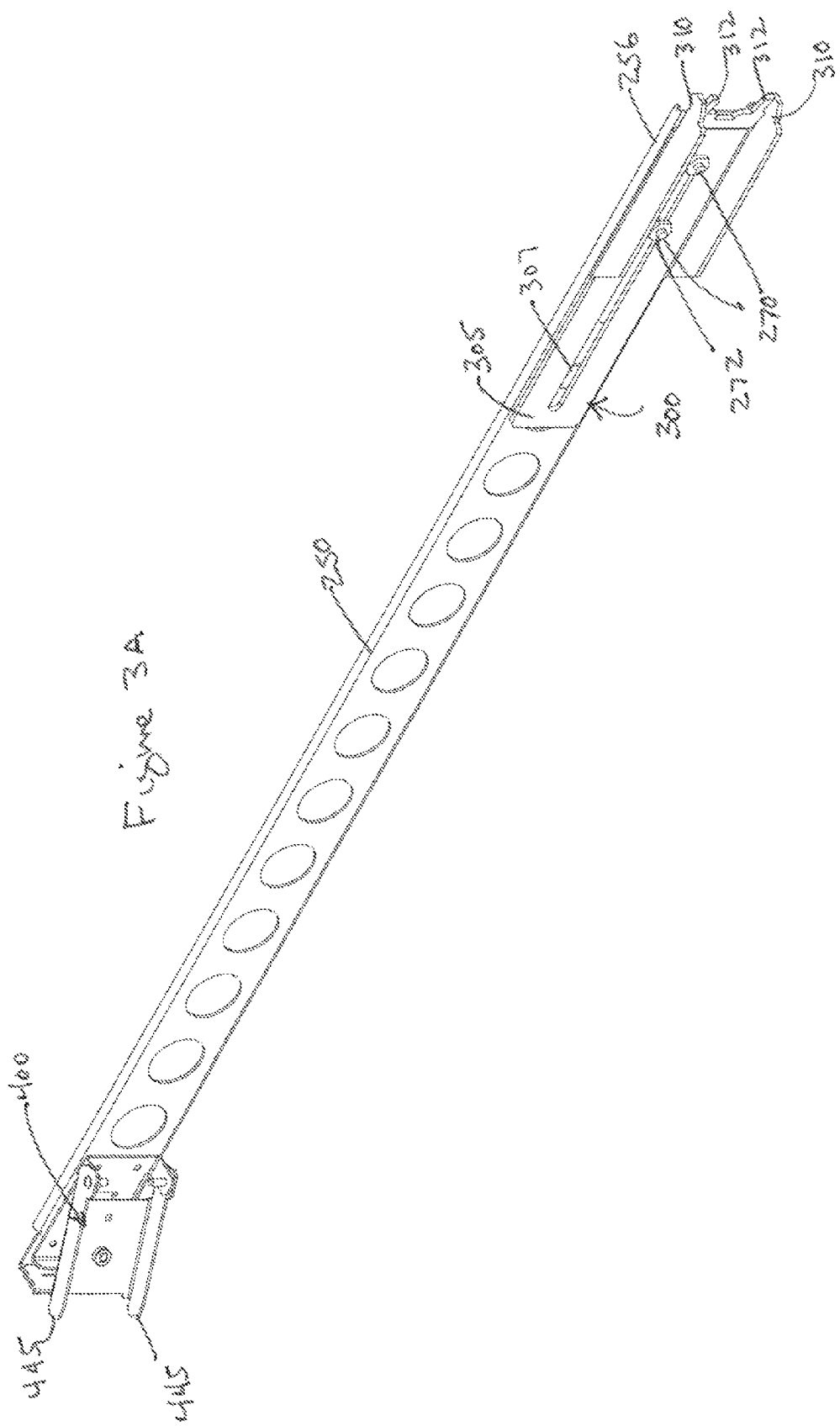

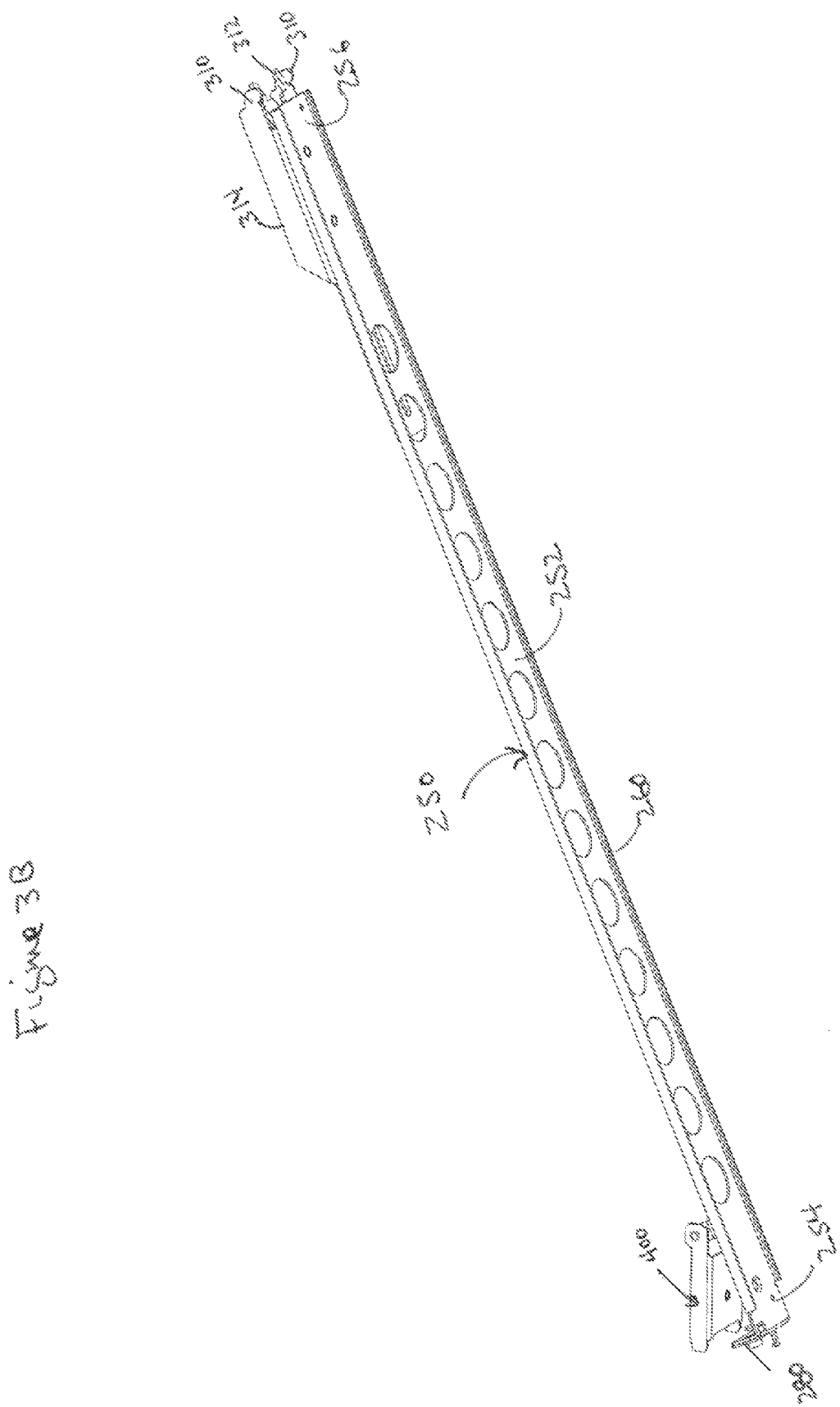

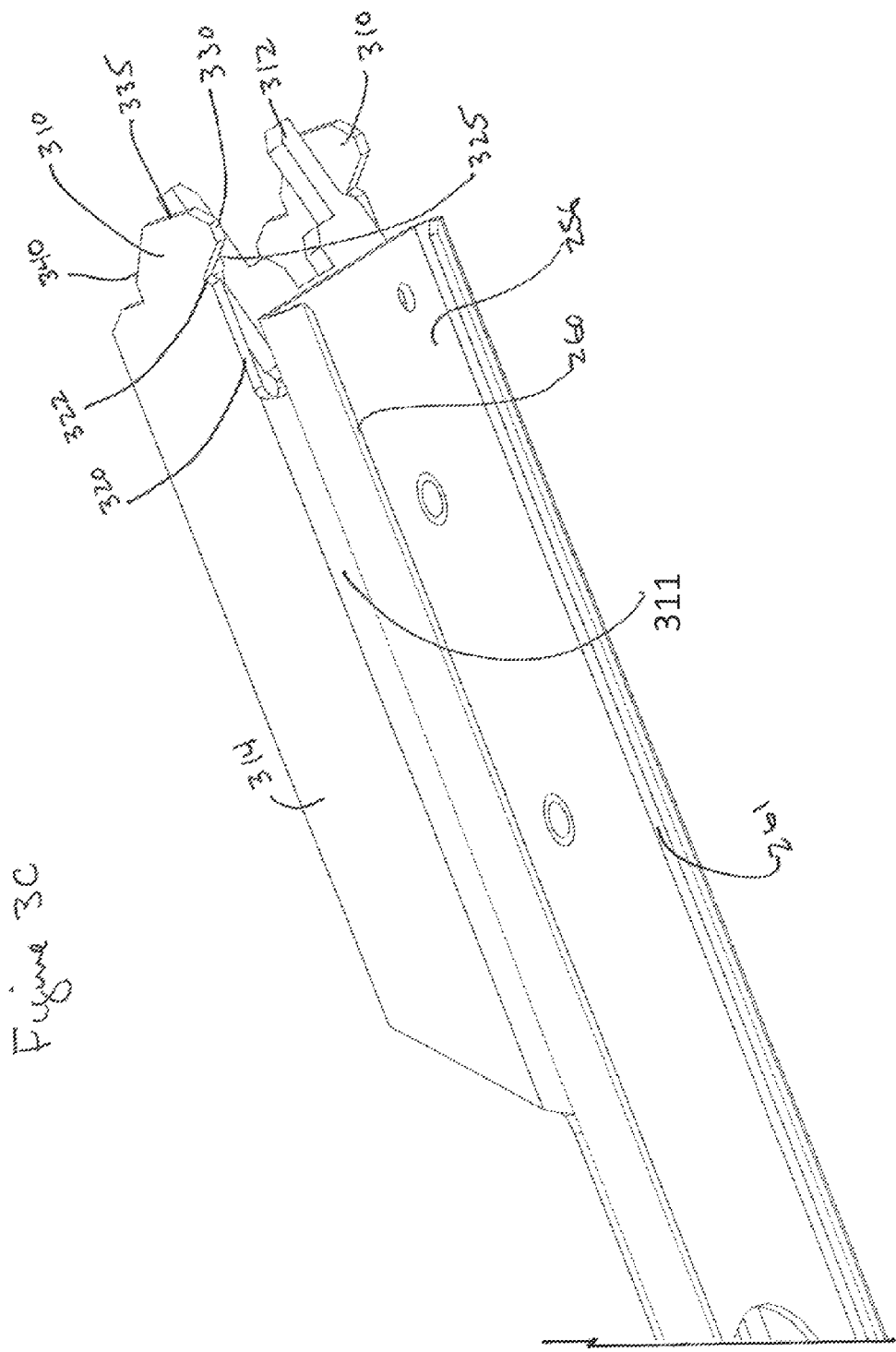

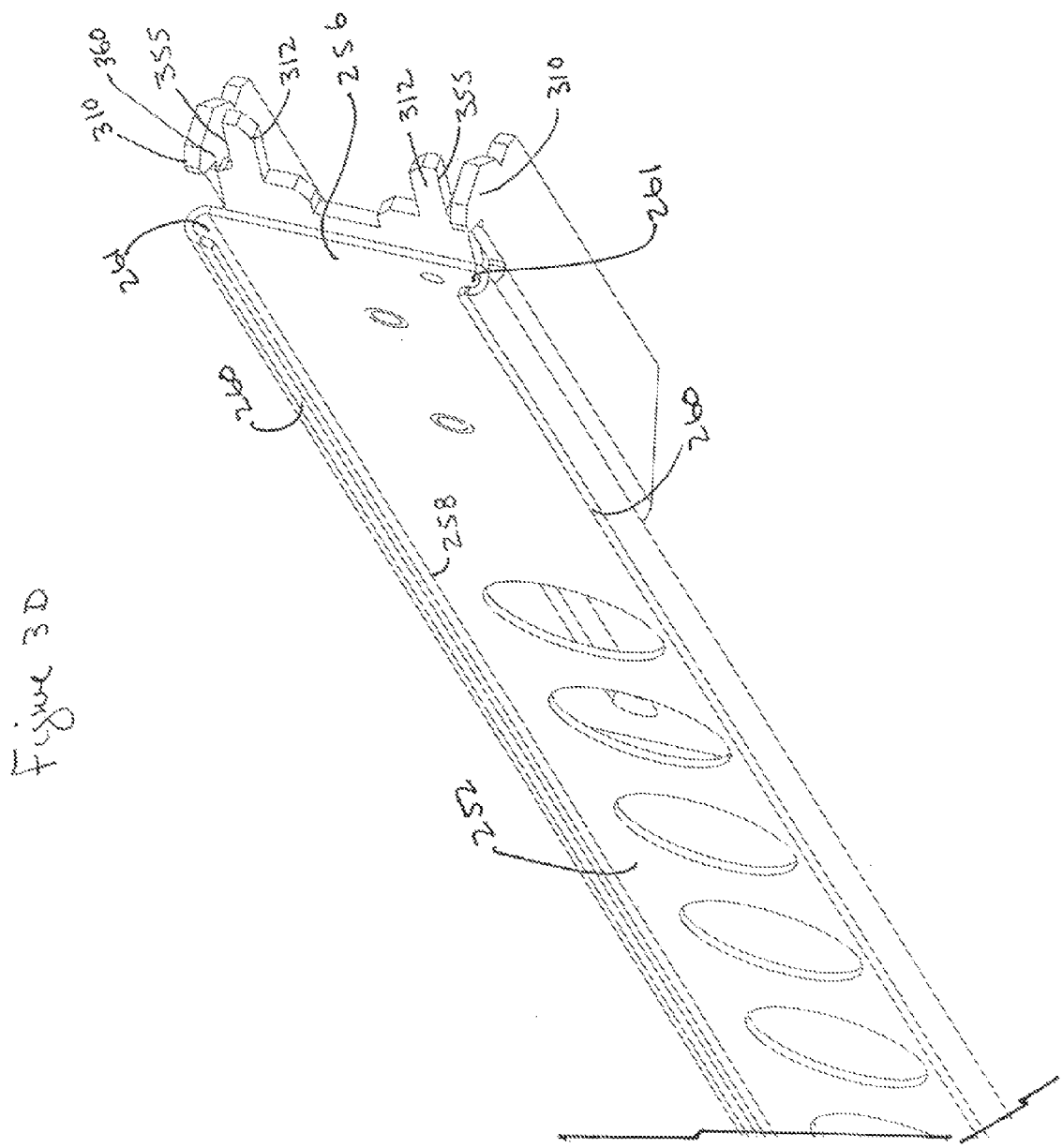

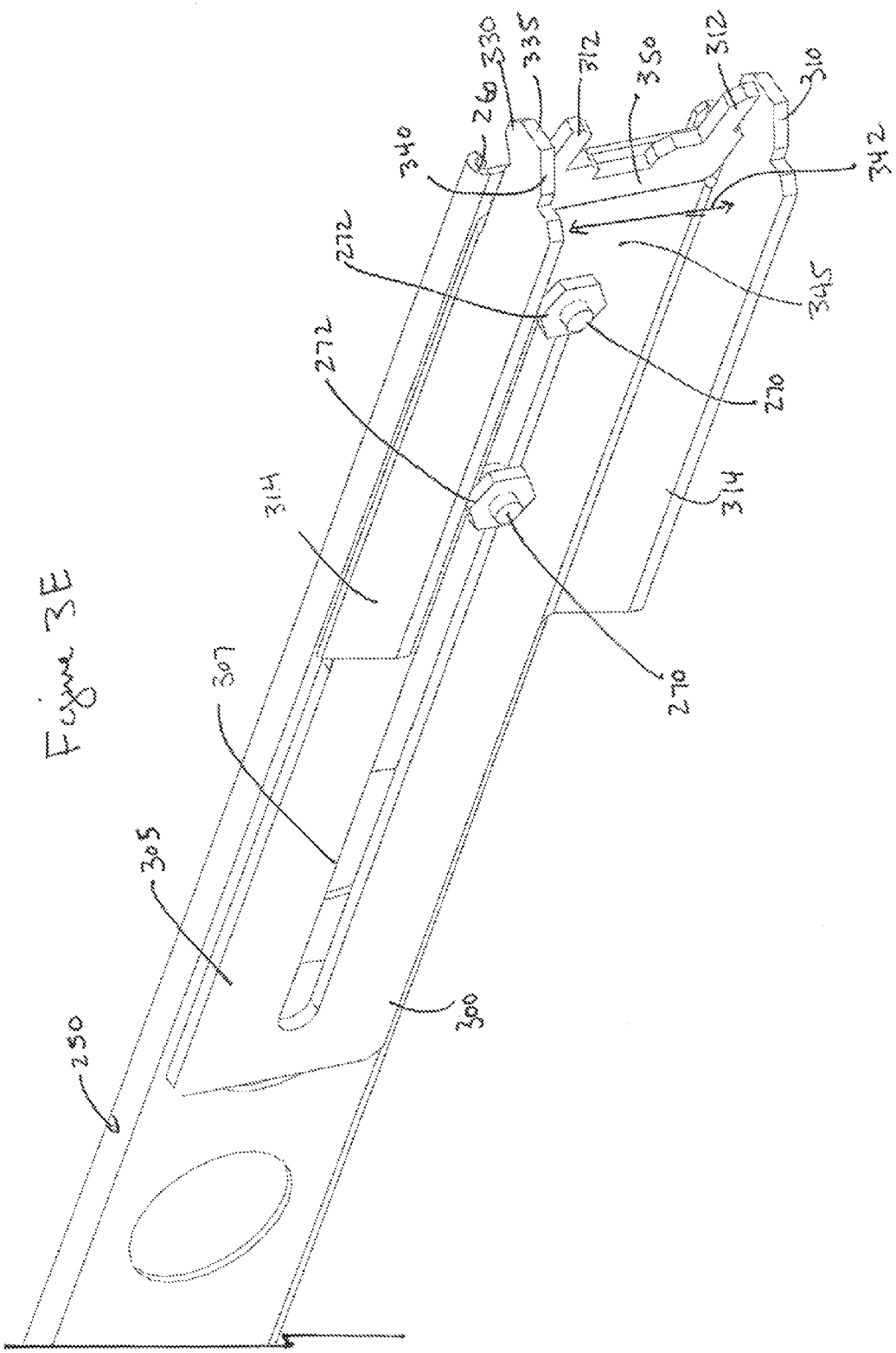

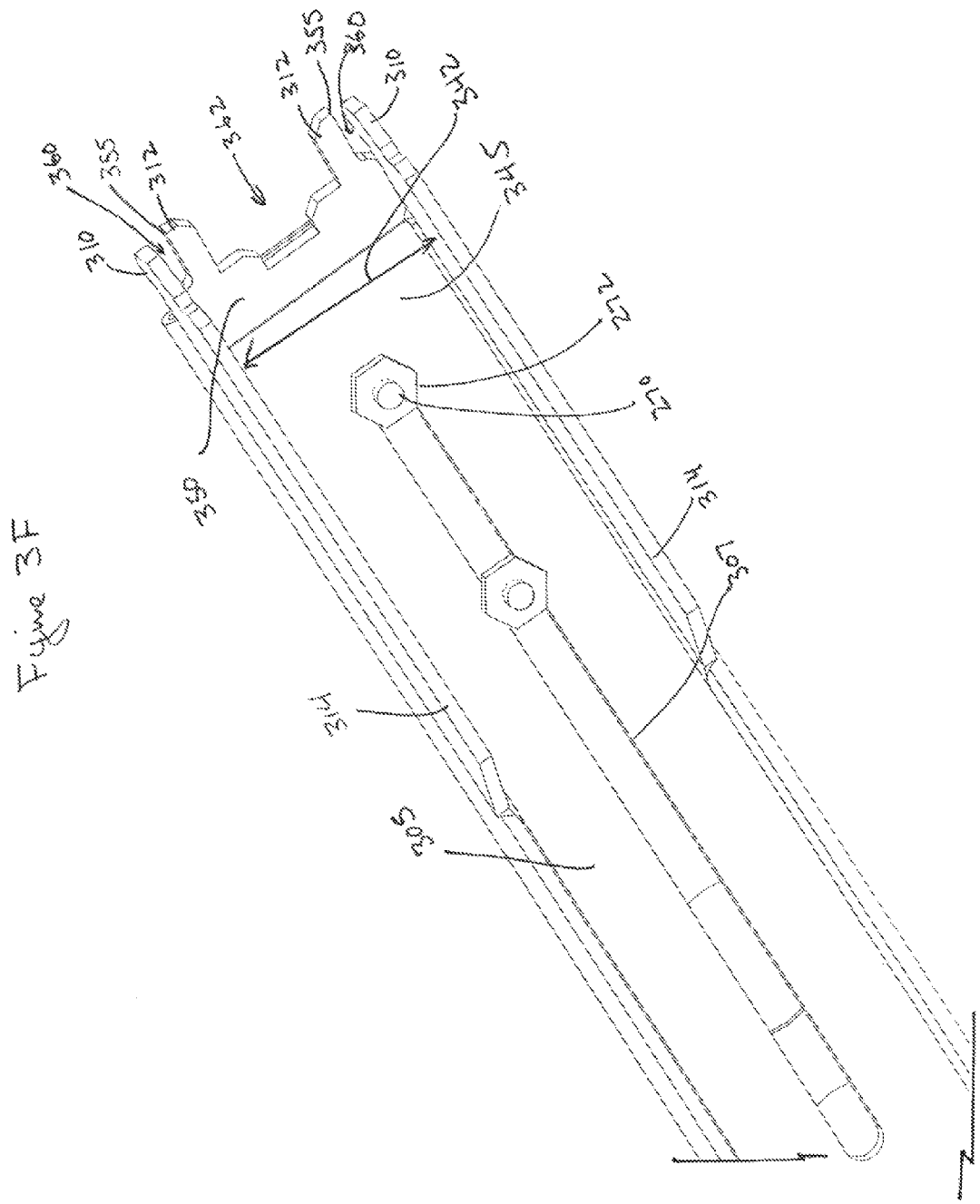

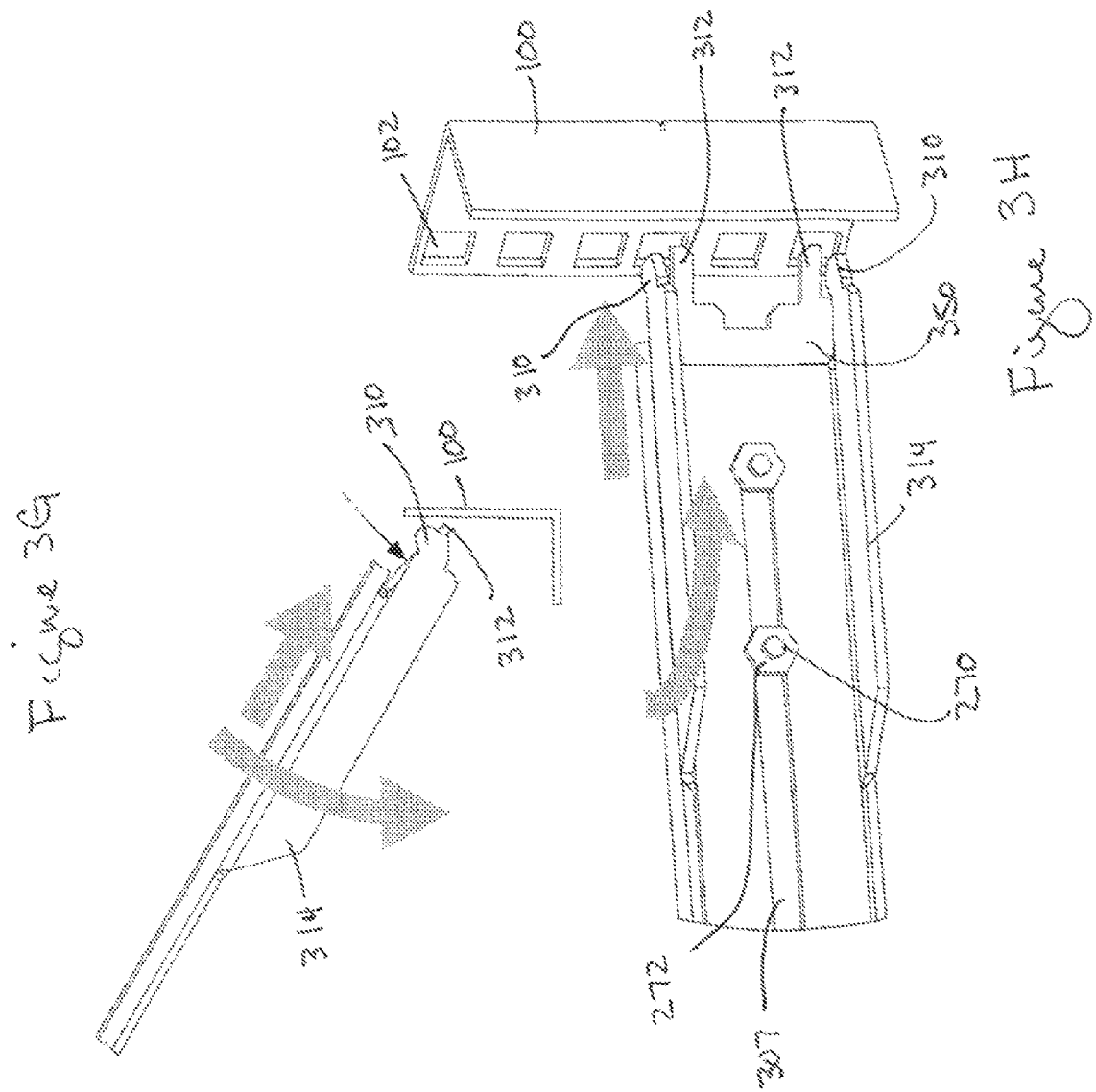

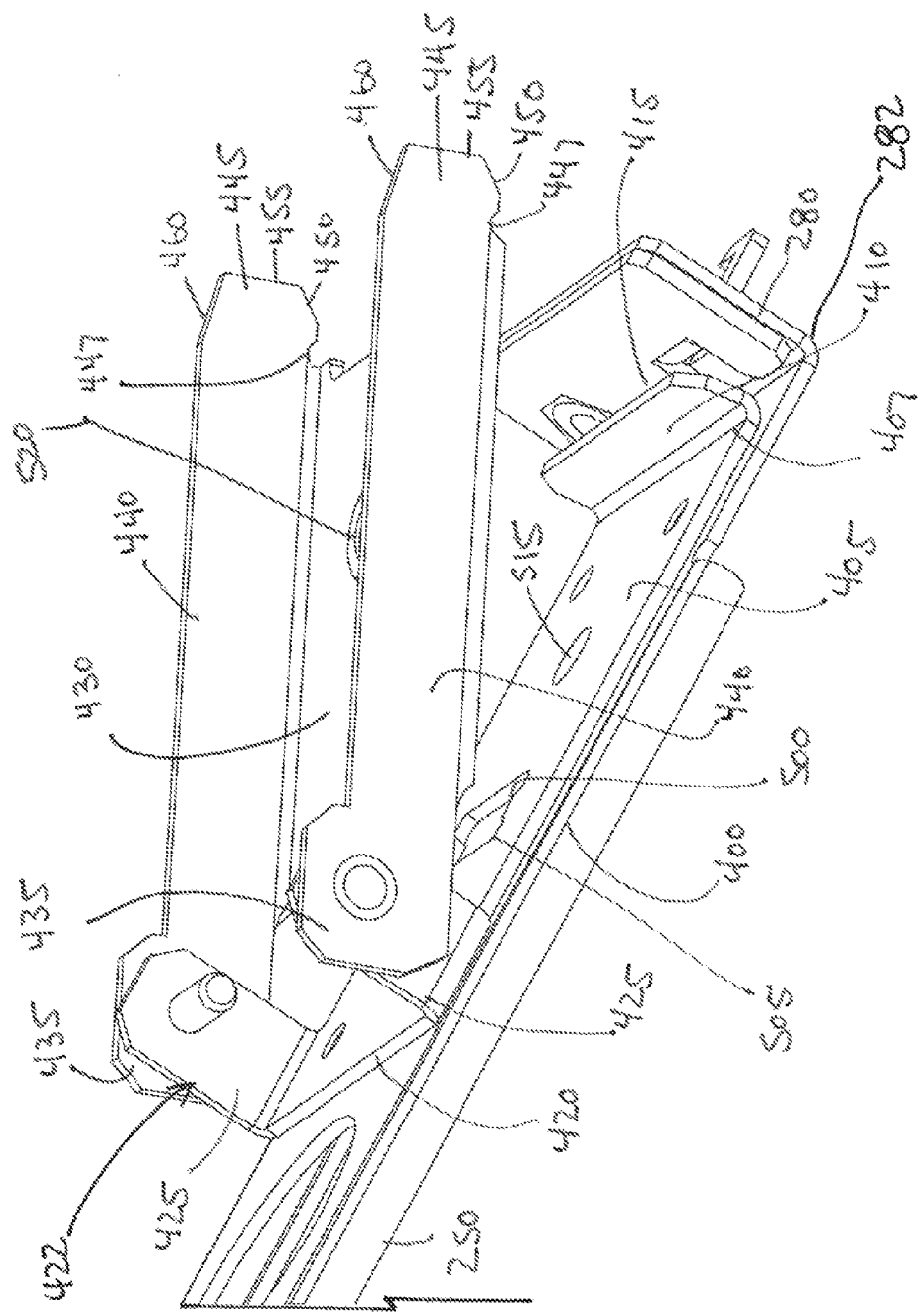

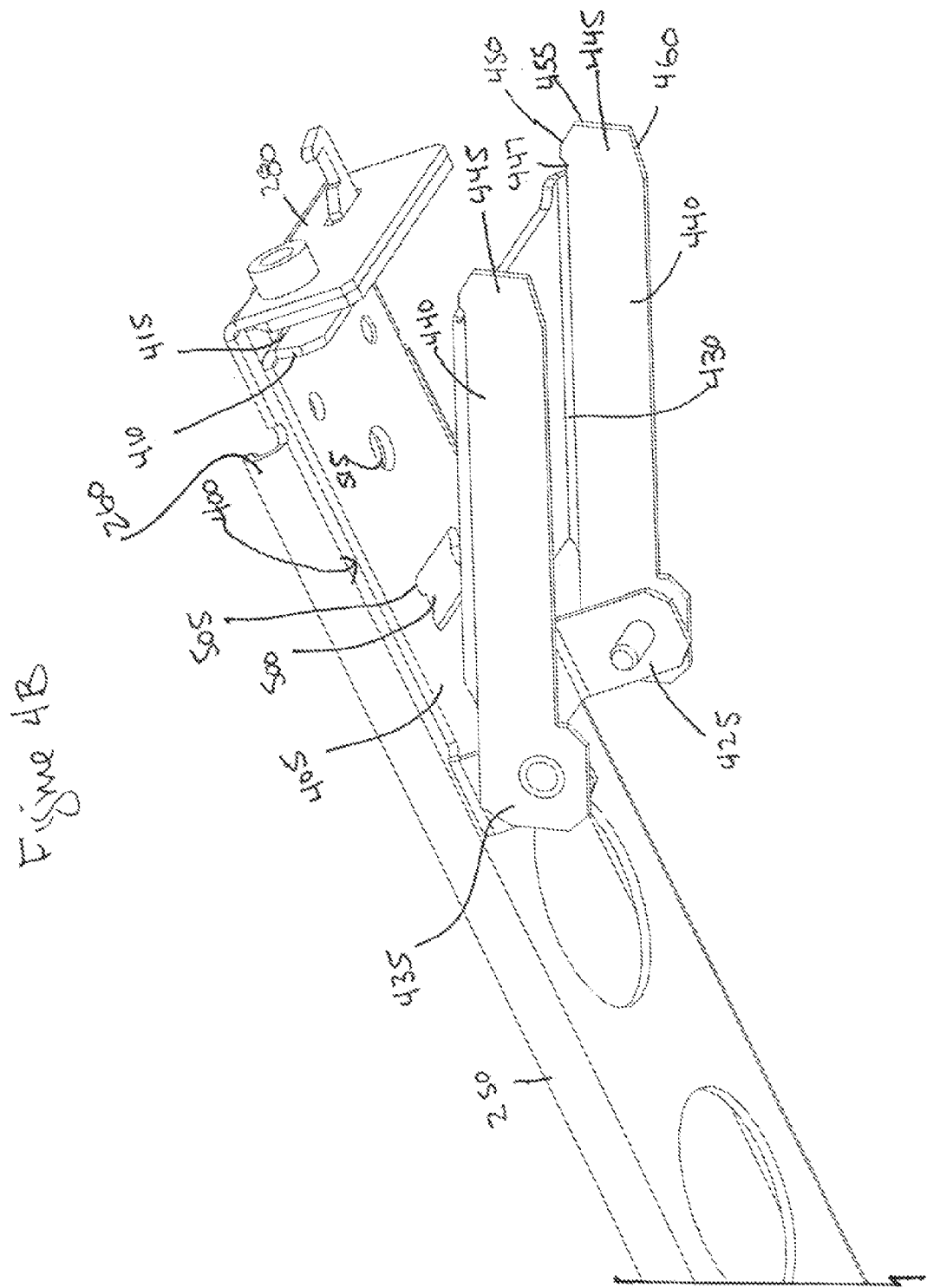

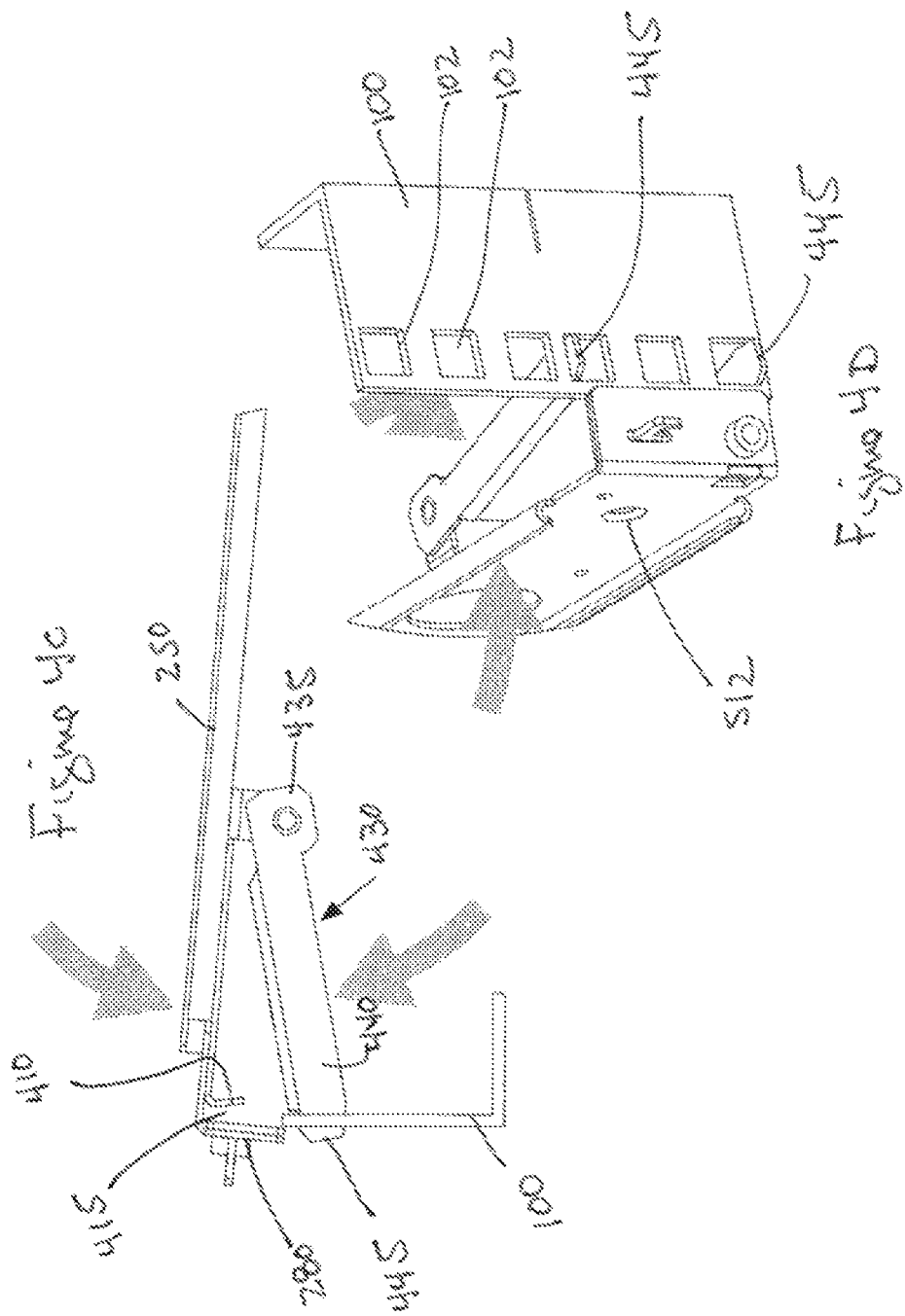

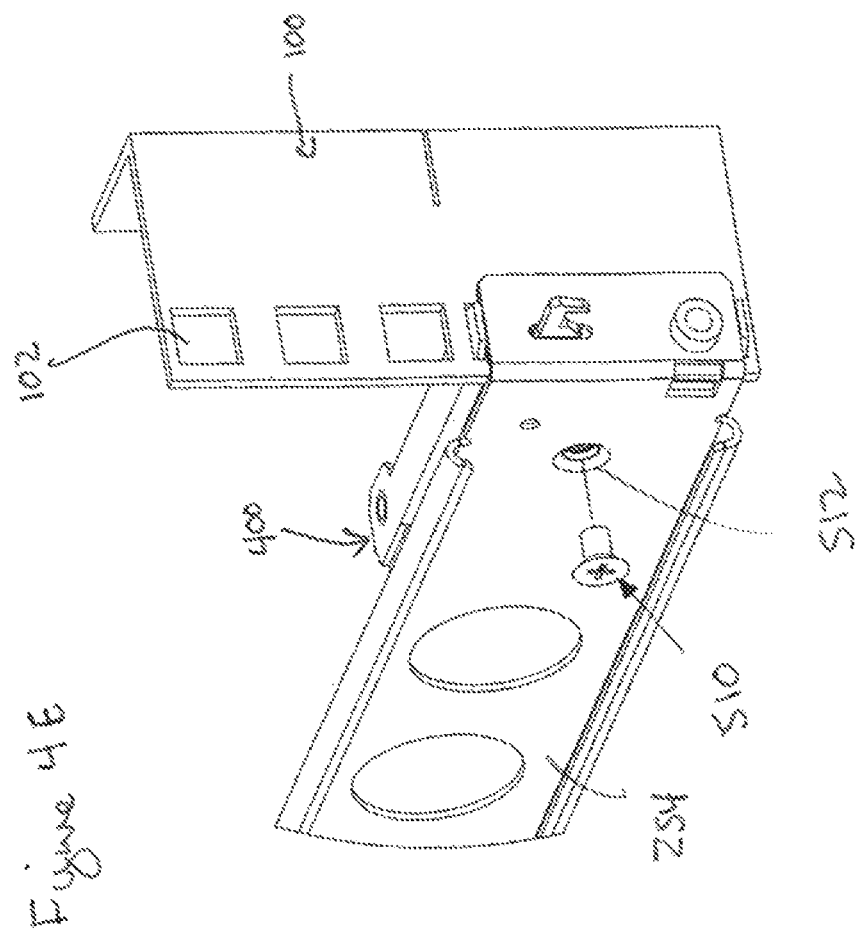

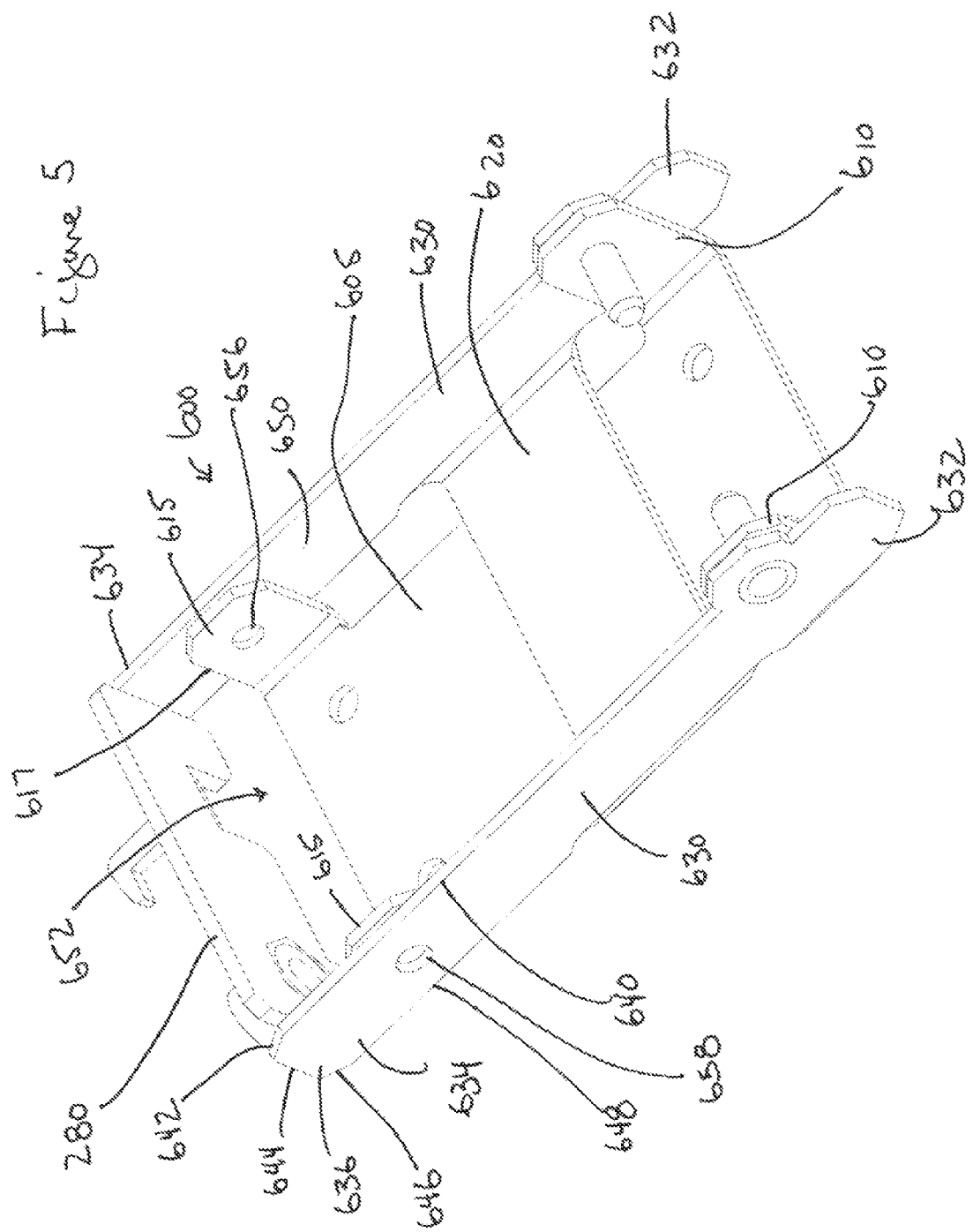

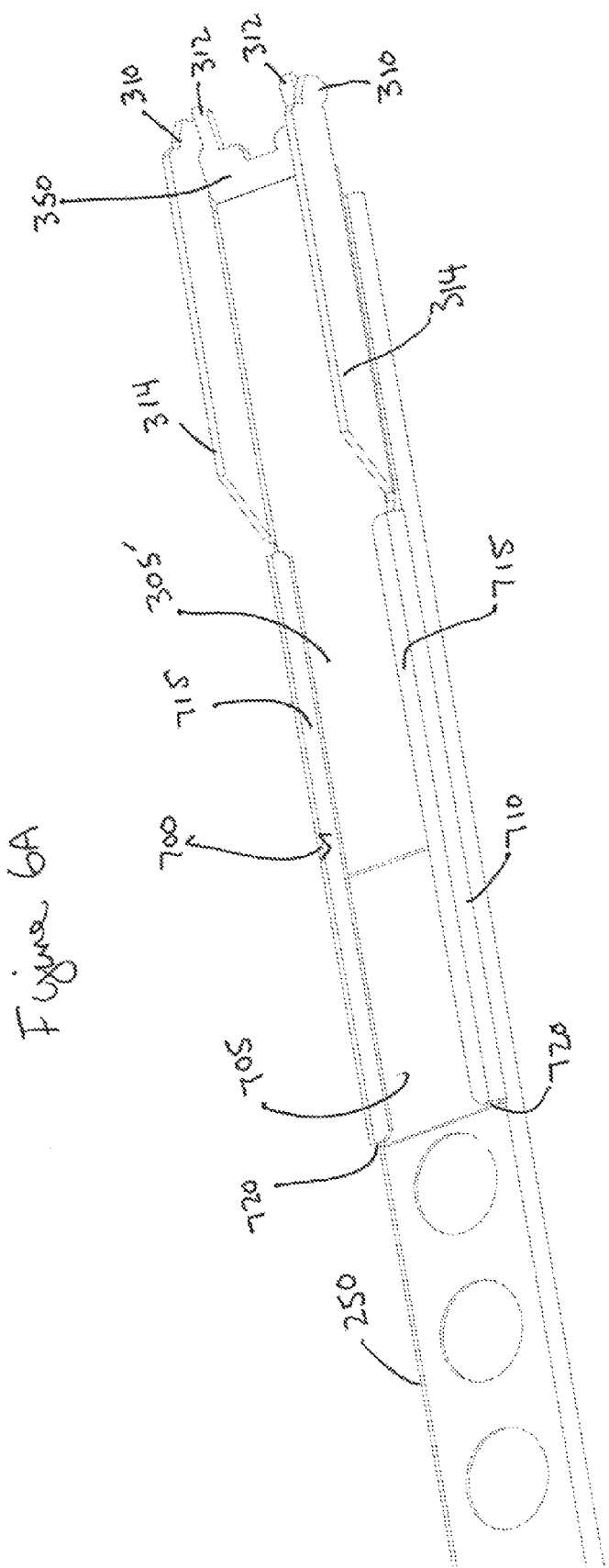

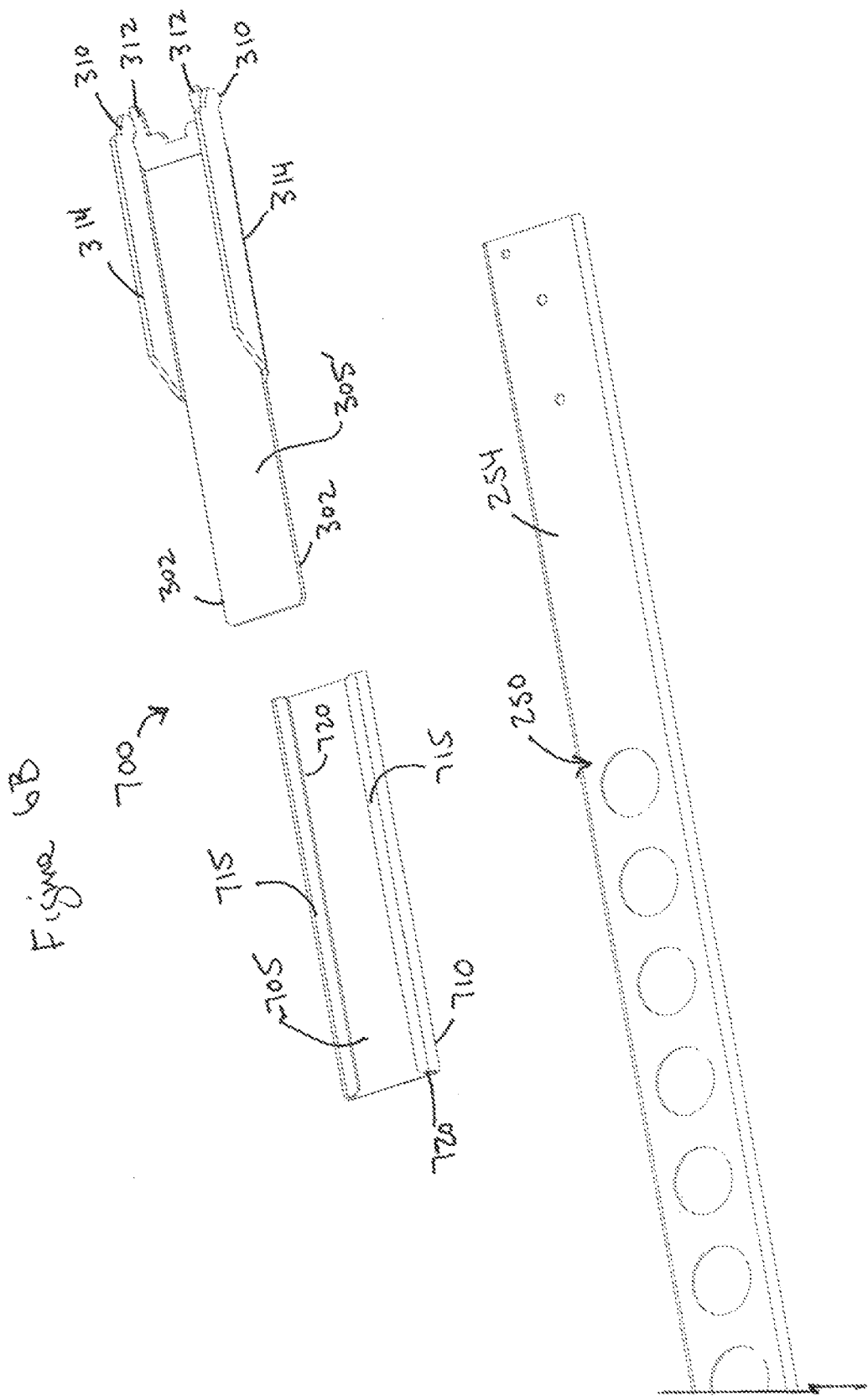

SLIDING RACK-MOUNTABLE RAILS FOR RACK-MOUNTABLE COMPONENTS

TECHNICAL FIELD

The present invention relates to sliding rack-mountable rails for a rack-mounted support structure. More particularly, the invention relates to a novel sliding rail support structure designed to reduce the need for tools and time for installing the sliding rail support structure.

BACKGROUND OF THE INVENTION

A variety of mechanical mounting structures have been devised for various structures including computer systems. In but one example, such as a server system, a number of sub-components or servers are arranged in a central cabinet or on a rack structure. The servers are typically mounted in stacked vertical arrangements, with each server being secured within the cabinet by a sliding rail structure. The sliding rail structures permit the servers to be extracted and reinserted easily into the cabinet, such as for servicing of internal components of the servers. In general, it is desirable to allow each server to be fully or nearly fully withdrawn from the cabinet in order to gain a high degree of access to internal components of the individual server. Following such service, the individual server may be closed and reinserted into the cabinet for normal operation.

Conventional server rail mounting racks include side support rails which interface with a sliding rail. The support rail is mounted within the cabinet, while the sliding rail is secured to the individual servers Because the servers are often quite heavy, and, when fully extended, constitute a significant cantilevered load, the support and sliding rail structures must offer a considerable resistance to loading, while affording easy sliding motion during displacement of the server.

While sliding rail mounting structure of the type described above are generally quite effective at adequately supporting servers and other computer components, they were not without disadvantages. For example, for most sliding rail mounting structures require tools for the installation or to ensure the rails are adequately secured to the racks. Since the rear ends of the sliding rails are often in the back of the racks, space or access may be highly restricted preventing the user from easily installing the sliding rails and servers.

There is a need, therefore, for an improved technique for installing mounting computer components within a cabinet or rack. In particular, there is a need for a telescopically sliding rail mount which can be installed without tools. Furthermore, there is a need for a support structure for computer components which offers the access advantages aforementioned. In addition, the sliding rack-mountable rails could be used in other industries to provide an easy access to cabinets or rack structures.

SUMMARY OF THE INVENTION

In accordance with various aspects of the invention, there is provided a support rail assembly for supporting a computer server in a rack system. The rack system typically have front and rear racks each with a plurality of openings. The support rail assembly includes a pair of rails, with each rail having an inner rail subassembly and an outer rail subassembly. The inner rail has a lateral base for alignment with a side of the computer server. The lateral base has one or more keyholes adapted for use with a corresponding lug(s) extending from the side of the computer server. The inner rail further has flanges extending outwardly from the lateral base.

The outer rail subassembly has an elongated support with a front end and a rear end. The elongated support further includes sides terminating to inwardly curved edges to form edge channels sized to slidably receive the flanges on the inner rail. The outer rail subassembly further includes a rear end bracket and a front end bracket. The rear end bracket is slidably attached to the rear end of the outer rail. The rear end bracket includes a pair of rearward locking flanges extending from the rear end bracket and distally positioned from one another to form a rearward gap there-between. The rear end bracket further includes a pair of piloting flanges extending from the rear end bracket in the rearward gap between the pair of rearward locking flanges. The pair of rearward locking flanges and the piloting flanges are positioned to slid through the openings in the rack and engage the rack to secure the rear end of the outer rail thereto.

The front end bracket is secured to the front end of the outer rail and includes a forward plate outwardly extending from the front end of the outer rail and defining a front end gap between the forward plate and a front face extending outwardly from an edge of the front end of the outer rail. The front end bracket further includes a rearward section pivotally engaging a top plate, the top plate includes lateral sides extending therefrom and terminating into forward locking flanges. The pair of forward locking flanges are positioned to slid through openings in the rack and engage the rack to secure the front end of the outer rail to the rack, with a portion of the rack sliding into the front end gap between the forward plate and a front face.

In another aspect of the present invention, the inner rail may include curved shoulders extending between the lateral base and the outwardly extending flanges to create an inner rail channel between the shoulders and the lateral base.

In yet another aspect, the rear end bracket may thus include a plate having a slot defined along the plate and sized to receive at least one fastener that is secured at one end to the rear end of the outer rail and positioned at another end through the slot, and the at least one fastener further includes a cap or nut secured around the fastener such that the rear end bracket is configured to slide relative to the rear end of the outer rail along the slot without separating therefrom. As such, the plate on the rear end bracket may further include side edges terminating into lateral projections extending from the plate, each of the lateral projections include along one end thereof one of the pair of rearward locking flanges.

In yet another embodiments, the rearward locking flanges may include a first inside edge extending from the lateral projection, a first angled edge tapered from the first inside edge and away from the lateral projection, a notch positioned between the first inside edge and the first angled edge, and a second angled edge tapered towards the lateral projection, and wherein the first and second angled edges are configured to allow the outer rail to slide and pivot into engagement and settle into a secured positioned with the rack when a portion of the rack rests in the notch.

In yet further aspects, the plate may terminate to a pilot plate angled away from the rear end of the outer rail, the pilot plate includes the pair of piloting flanges extending therefrom, such that the piloting flanges extend at an angle away from the rear end of the outer rail. Other aspects may provide for a magnet positioned to engage a portion of the top plate to maintain the front end bracket in a closed positioned.

Numerous other advantages and features of the invention will become readily apparent from the following detailed description of the invention and the embodiments thereof, from the claims, and from the accompanying drawings.

DESCRIPTION OF DRAWINGS

A fuller understanding of the foregoing may be had by reference to the accompanying drawings, wherein:

FIG. 1A is a perspective view of a server secured to a rack shelf using the sliding rails in accordance with one embodiment of the present invention;

FIG. 1B is a perspective view of the server prior to being slid into the rails in accordance with one embodiment of the present invention;

FIGS. 2A & 2B are perspective views of the sliding rails in accordance with one embodiment of the present invention;

FIG. 2C is an illustration of an inner rail being secured to the server in accordance with one embodiment of the present invention;

FIGS. 3A & 3B are perspective views of the outer rail in accordance with one embodiment of the present invention;

FIGS. 3C-3F are enlarged perspective views of the rear end bracket as attached and secured to the rear end of the outer rail;

FIGS. 3G & 3H are perspective views of the rear end bracket being secured to a rack in accordance with one embodiment of the present invention;

FIGS. 4A & 4B are enlarged perspective views of the front end bracket as attached and secured to the front end of the outer rail;

FIGS. 4C & 4D are perspective views of the front end bracket being secured to a rack in accordance with one embodiment of the present invention;

FIG. 4E is a perspective view of the front end bracket secured to a rack in accordance with one embodiment of the present invention;

FIG. 5 is a perspective view of an alternative bracket in accordance with one embodiment of the present invention; and FIGS. 6A & 6B are perspective views of an alternative bracket in accordance with one embodiment of the present invention.

DETAILED DESCRIPTION OF THE EMBODIMENTS

While the invention is susceptible to embodiments in many different forms, there are shown in the drawings and will be described in detail herein the preferred embodiments of the present invention. It should be understood, however, that the present disclosure is to be considered an exemplification of the principles of the invention and is not intended to limit the spirit or scope of the invention and/or claims of the embodiments illustrated.

Various embodiments of the principles of the present invention are shown in FIGS. 1A-4E. The present invention comprises a sliding support shelf for electronic and related components to be supported in rack systems of various configurations. The sliding support shelf of the present invention is designed to provide support for components adapted/configured for use with rack systems, such as servers and other electronic components.

As illustrated in FIG. 1, there is shown corner racks 100 that extend vertically and that are designed to support servers 110 or electronic and related components. The racks 100 include openings 102 spaced along the length of the racks 100 to receive and secure to ends of rail assemblies 200. The rail assemblies 200 once attached to the support servers 110 and secured to the racks 100 allow the services to slide in and out of the racks 100. As mentioned above and as described below, the rail assemblies 200 are easily attached to the racks 100 without tools providing for an extremely easy attachment and installation.

As illustrated in FIGS. 2A-2C, the rail assemblies 200 include an inner rail 205 and an outer rail 250. The inner rail 205 includes a base 210 with interspaced keyholes 207. The side edges 212 of the base 210 turn away to form shoulders 214 to create a channel 216 therebetween. The shoulders 214 terminate into flanges 218 that extend outwardly away from the shoulders 214. During installation, the inner rail 205 is secured to sides of the support server 110 by sliding lugs 112 on the side of the support server 110 into the keyholes 207. The inner rail 205 slides onto the lugs 112 until a retaining clip 217 on an end 220 of the base 210 of the inner rail locks one of the lugs 112 in place. This process would be repeated for the other side of the support server 110.

Referring now also to FIGS. 3A-3H, the outer rail 250 includes a base 252 that includes front and rear ends 254, 256, respectively, and includes sides 258 that terminate to edges 260 curved inwardly to form an outer channel 268 sized to receive the flanges 218 defined on the inner rail, which as detailed below permits the inner rail to slide in and out of the outer rail. The front end 254 and the rear end 256 each include a specifically designed bracket to aid in securing the outer rail to the racks.

The rear end bracket 300 includes a plate 305 that includes a slot 307. The slot 307 receives at least one fastener 270 that is secured at one end to the rear end 256 and includes a cap or nut 272 on the other end thereby securing the rear end bracket 300 to the rear end 256 of the outer rail 250. The slot 307 permits the rear end bracket 300 to slide along the rear end 256 of the outer rail. The rear end bracket 300 further includes rearward locking flanges 310 and piloting flanges 312 to aid in securing the rear end 256 of the outer rail to the rack.

The plate 305 includes side edges 311, adjacent the curved edge 260 of the outer rail, which terminate into lateral projections 314 extending away from the plate 305. The lateral projections 314 include, along one end, the rearward locking flanges 310. The rearward locking flanges 310 are defined to have an first inside face 320 extending from the lateral projection 314. The first inside face 320 extends into a first angled face 325 that is angled towards the base 252 of the outer rail 250. A notch 322 is positioned between the first inside face 320 and the angled face 325. From the angled face 325 the locking flange 310 further has a rounded face 330 (rounded away from the base 252 of the outer rail 250) that terminates into a flat edge 335. The flat edge 335 extends to a second angled face 340 that is facing opposite to the first angled face 325. The second angled face 340 then terminates back to the lateral projection 314.

The plate 305 further includes a rear portion 345 terminating towards the rear of the outer rail 250, the rear portion 345 includes a piloting plate 350 angled away from the outer rail. The piloting plate 350 includes a pair of piloting flanges 312 extending therefrom. The piloting flanges 312 are positioned between the rearward locking flanges 310 and include a grooved outer edges 355 to create outside gaps 360 between the outside portions of the piloting flanges 312 and the rearward locking flanges 310. As noted, the piloting flanges 312 extend from the piloting plate 350 and therefore further include an inside gap 362 between the inside portions of the piloting flanges 312.

During installation, the rear end bracket 300 is aligned such that the piloting flanges 312 and the rearward locking flanges 310 are inserted through the openings 102 in the racks 100.

The insertion is done at a slight angle and then the outer rail is slightly pivoted such that the rack rests against the notches 322. The inside gap 362 allows the piloting flanges 312 to insert into the openings without interference from the piloting plate 350. Once inserted and straightened the outer rail 205 may slid forward and backwards along the slot 307 in the rear end bracket 300 to accommodate slight differences in lengths between rear rack pieces and front rack pieces.

Continuing to refer to FIGS. 3A-3H and also to FIGS. 4A-4E, the front end bracket 400 is secured to the front end 254 of the outer rail 250. The front end bracket 400 includes a front plate 405 secured to the front end 254 of the outer rail 250. The front plate 405 includes a forward section 407 terminating into an outwardly extending forward plate 410. A defined forward gap 415 is created between the outwardly extending forward plate 410 and a front face 280 that extends outwardly from the edge of the front end 254 of the outer rail 250. The front plate 405 also includes a rearward section 420 that has a pair of arms 425 extending upwardly and which pivotally engage a top plate 430. The top plate 430 include a pair of rearward extending arms 435 which pivotally attach to the pair of arms 425 on the front plate 405. The top plate 430 further includes lateral sides 440 extending on the sides of the top plate 430. Each lateral side 440 terminates into forward locking flanges 445. Each forward locking flange 445 includes an inside face 450 tapered away from the lateral side 440 to a flat edge 455 and then moving to an outside face 460 which tapers towards the lateral side 440. In addition, a notch 447 is positioned between the lateral side 440 and the inside face 450.

During installation, after the rear end bracket 300 is installed, the user installs the front end bracket 400. First, the user opens the front end bracket 300 by pivoting the top plate 430 away from the front plate 405. The forward locking flanges 445 are then inserted into the openings 102 in the rack 100. Once inserted, the outer rail is pivoted to close the top plate 430 relative the front plate 405, placing a section of the rack 100 in the forward gap 415 between the outwardly extending forward plate 410 and the front face 280.

In addition, a magnet 500 may be positioned in an aperture 505 defined on either the top plate 430 or the front plate 405 to help keep the front end bracket 400 closed. If the top and front plates are metallic in structure then the magnet may simply attach to the plate itself; however, if necessary a pair of magnets may be used to help keep the plates closed.

Lastly, a small screw 510 may be set into an opening 512 in the front end of the outer rail and which is aligned with openings 515 and 520 in the front plate 405 and top plate 430.

In one embodiment of the present invention, there is provided a support rail 200 for supporting an equipment component 110 on a rack system 100. The rack system has first and second racks 100 each with a plurality of openings 102. The support rail includes a pair of rails, each rail having a first rail 250 with a first end bracket 300, and a second end bracket 400. The first rail 250 includes an elongated support with a first end 256 and a second end 254.

The first end bracket 300 is slidably attached to the first end 256 of the first rail 250. The first end bracket includes a pair of first locking flanges 310 extending from the first end bracket and distally positioned from one another to form a first gap 342 there-between. The first end bracket 256 further includes a pair of piloting flanges 312 extending from the first end bracket in the first gap 342 between the pair of first locking flanges 310, such that the pair of first locking flanges 310 and the piloting flanges 312 are positioned to slid through the openings 102 in the rack 100 and engage the rack to secure the first end 256 of the first rail 250 thereto.

The second end bracket 400 is secured to the second end 254 of the first rail. The second end bracket 400 includes a plate 410 that is outwardly extending from the second end bracket to define a second gap 415 between the plate 410 and a face member 280, which extends outwardly from an edge 282 of the second end 254 of the first rail 250. The second end bracket 400 further includes a section 422 pivotally engaging a top plate 430. The top plate includes lateral sides 440 extending therefrom that terminate into second locking flanges 445. The pair of second locking flanges 445 are positioned to slid through openings 102 in the rack 100 and engage the rack to secure the second end 254 of the first rail to the rack. In addition, to better secure the second end thereto, a portion of the rack slides into the second gap 415 between the plate 410 and a face member 280.

The support rail 200 may further include a second rail 205 having a lateral base 210 for alignment with a side 114 of the equipment component 110. The lateral base 210 having at least one keyhole 207 adapted for use with a corresponding lug 112 extending from the side of the equipment component. The second rail 205 may further have flanges 218 extending outwardly from the lateral base. The elongated support 252 of the first rail further including sides terminating to inwardly curved edges 260 to form edge channels 261 sized to slidably receive the flanges 218 on the second rail 205.

The first end bracket 300 may include a plate 305 having a slot 307 defined along the plate and sized to receive at least one fastener 270 that is secured at one end to the first end of the first rail and positioned at another end through the slot. The at least one fastener further includes a cap or nut 272 secured around the fastener such that the first end bracket is configured to slide relative to the first end of the first rail along the slot without separating therefrom.

The plate 305 on the first end bracket 300 may further include side edges 310 terminating into lateral projections 314 extending from the plate. Each of the lateral projections 314 include along one end thereof one of the pair of first locking flanges 310. In addition, the plate 305 may further terminate to a pilot plate 350 angled away from the first end of the first rail. The pilot plate 350 includes the pair of piloting flanges 312 extending therefrom, such that the piloting flanges extend at an angle away from the rear end of the outer rail.

The second end bracket 400 includes a second plate 405 secured to the second end of the first rail. The second plate 405 includes a pair of arms 425 extending upwardly from a section 422 to pivotally engage a pair of second arms 435 extending from the top plate 430. As noted above, magnet(s) or other clipping/securing mechanism may be used to engage a portion of the top plate to maintain the second end bracket in a closed positioned.

Referring now to FIG. 5, there is illustrated another end bracket 600 configured to be secured on one end of the outer rail 250. The end bracket 600 includes a base plate 605 secured to the end of the outer rail 250. The base plate 605 includes a first pair of arms 610 extending from one portion of the base plate and includes a second pair of arms 615 extending from a second portion of the base plate. The first pair of arms 610 extend upwardly and pivotally engage a top plate 620. The top plate 620 includes a pair of lateral sides 630 that extend away from the top plate 620. Each lateral side 630 has a first end that pivotally engages the pair of arms 610, while a second end 634 distally positioned along the lateral side terminates into forward locking flanges 636. Each forward locking flange 636 includes an inside face 642 tapered away from the lateral edge 640 to a flat edge 644 and then moving to an outside face 646 which tapers towards a second lateral edge 648. The second pair of arms 615 extending from the base plate 605 are configured to engage an interior surface 650 of the lateral sides 630, such that when in a closed configuration, as shown, the bracket has a tendency to remain in the closed configuration. In addition, the second pair of arms 615 further include an edge 617 which creates a gap 652 between the edges 617 of the second pair of arms 615 and a front face 280 that extends outwardly from the edge of the front end 254 of the outer rail 250. If necessary, openings 656 in the second pair of arms may align with openings 658 in the lateral sides to allow fasteners to be inserted to ensure the bracket maintains a closed configuration.

Referring now to FIGS. 6A and 6B, there is illustrated an alternative embodiment for a bracket 700 similarly configured to bracket 300, except the bracket 700 includes a guide plate 705 that is secured to the end 254 of the rail 250. The guide plate 705 includes side 710 that terminate to inwardly curved edges 715 to form channels 720 sized to receive the edges 302 of plate 305'. The only difference between plate 305 noted above and plate 305', is plate 305' does not require the slot, because the guide plate 705 allows the plate 305' to be slidably engaged to the rail. The remaining elements of plate 305' including the locking flanges and piloting flanges are similarly configured.

From the foregoing and as mentioned above, it is observed that numerous variations and modifications may be effected without departing from the spirit and scope of the novel concept of the invention. It is to be understood that no limitation with respect to the embodiments illustrated herein is intended or should be inferred. It is intended to cover, by the appended claims, all such modifications within the scope of the appended claims.

We claim:

1. A support rail assembly in combination with a computer rack system, the support rail assembly configured to support a load in the computer rack system, wherein the computer rack system has pairs of front and rear racks and each rack having a plurality of openings, the support rail assembly comprising:
   a pair of rails configured to be secured to sides of a computer equipment and secured to the rack system such that the computer equipment is in a slideable engagement with the rack system for ease of installation and removal, each rail having:
      an inner rail having a lateral base for alignment with a side of the computer equipment, the lateral base having a keyhole adapted for use with a corresponding lug extending from the side of the computer equipment, the inner rail further having flanges extending outwardly from the lateral base; and
      an outer rail having an elongated support with a front end and a rear end, the elongated support further including sides terminating to inwardly curved edges to form edge channels sized to slidably receive the flanges extending from the inner rail, the outer rail further including:
         a rear end bracket slidably attached to the rear end of the outer rail, the rear end bracket includes a pair of rearward locking flanges extending from the rear end bracket and distally positioned from one another to form a rearward gap there-between, the rear end bracket further includes a pair of piloting flanges extending from the rear end bracket in the rearward gap between the pair of rearward locking flanges, wherein both the pair of rearward locking flanges and the pair of piloting flanges are positioned to slide through the openings in the rack and engage the rack to secure the rear end of the outer rail thereto; and
         a front end bracket secured to the front end of the outer rail, the front end bracket includes a forward plate outwardly extending substantially perpendicularly from the front end bracket to define a front end gap between the forward plate and a front face that is outwardly extending substantially perpendicularly from an edge of the front end of the outer rail, the front end bracket further includes a rearward section pivotally engaging a top plate, the top plate includes lateral sides extending substantially perpendicularly therefrom and terminating into forward locking flanges, and wherein the forward locking flanges are positioned to slide through openings in the rack and engage the rack to secure the front end of the outer rail to the rack, with a portion of the rack sliding into the front end gap between the forward plate and the front face and wherein each forward locking flange includes an inside face tapering away from the lateral side to a flat edge and further including an outside face tapering towards the lateral side, and further having a notch positioned between the lateral side and the inside face.

2. The support rail assembly of claim 1, wherein the inner rail further includes curved shoulders extending between the lateral base and the outwardly extending flanges to create an inner rail channel between the shoulders and the lateral base.

3. The support rail assembly of claim 1, wherein the rear end bracket includes a plate having a slot defined along the plate and sized to receive at least one fastener that is secured at one end to the rear end of the outer rail and positioned at another end through the slot, and the at least one fastener further includes a cap or nut secured around the fastener such that the rear end bracket is configured to slide relative to the rear end of the outer rail along the slot without separating therefrom and wherein the plate terminates to a pilot plate angled away from the rear end of the outer rail, the pilot plate includes the pair of piloting flanges extending therefrom, such that the piloting flanges extend at an angle away from the rear end of the outer rail.

4. The support rail assembly of claim 3, wherein the plate on the rear end bracket further includes side edges terminating into lateral projections extending from the plate, each of the lateral projections include along one end thereof one of the pair of rearward locking flanges.

5. The support rail assembly of claim 4, wherein each of the rearward locking flanges includes a first inside edge extending from the lateral projection, a first angled edge tapered from the first inside edge and away from the lateral projection, a notch positioned between the first inside edge and the first angled edge, and a second angled edge tapered towards the lateral projection, and wherein the first and second angled edges are configured to allow the outer rail to slide and pivot into engagement and settle into a secured position with the rack when a portion of the rack rests in the notch.

6. The support rail assembly of claim 1, wherein the front end bracket includes a front plate secured to the front end of the outer rail, and the front plate includes a pair of arms extending upwardly from the rearward section to pivotally engage a pair of rearward arms extending from the top plate.

7. The support rail assembly of claim 6, wherein the front plate includes a magnet positioned to engage a portion of the top plate to maintain the front end bracket in a closed position.

8. The support rail assembly of claim 7, wherein the portion of the top plate that is positioned to engage the magnet includes a second magnet or a metallic portion defined thereon.

9. A support rail for supporting an equipment component on a rack system, the rack system having front and rear racks each with a plurality of openings, the support rail comprising a pair of rails, each rail comprising:
a first rail having an elongated support with a first end and a second end;
a first end bracket slidably attached to the first end of the first rail, the first end bracket includes a pair of first locking flanges extending from the first end bracket and distally positioned from one another to form a first gap there-between, the first end bracket further includes a pair of piloting flanges extending from the first end bracket in the first gap between the pair of first locking flanges, wherein both the pair of first locking flanges and the pair of piloting flanges are configured to slide through the openings in the rack and engage the rack to secure the first end of the first rail thereto; and
a second end bracket secured to the second end of the first rail, the second end bracket includes a plate outwardly extending from the second end bracket to define a second gap between the plate and a face member extending outwardly from an edge of the second end of the first rail, the second end bracket further includes a section pivotally engaging a top plate, the top plate includes lateral sides extending therefrom that terminate into second locking flanges, and wherein the second locking flanges are configured to slide through openings in the rack and engage the rack to secure the second end of the first rail to the rack, with a portion of the rack sliding into the second gap between the plate and the face member and wherein the second end bracket includes a second plate secured to the second end of the first rail, and the second plate includes a pair of arms extending upwardly from the section to pivotally engage a pair of second arms extending from the top plate and wherein the second plate includes a magnet positioned to engage a portion of the top plate to maintain the second end bracket in a closed position.

10. The support rail of claim 9, further comprising:
a second rail having a lateral base for alignment with a side of the equipment component, the lateral base having at least one keyhole adapted for use with a corresponding lug extending from the side of the equipment component, the second rail further having flanges extending outwardly from the lateral base.

11. The support rail of claim 10, wherein the elongated support of the first rail further including sides terminating to inwardly curved edges to form edge channels sized to slidably receive the flanges extending from the second rail.

12. The support rail of claim 11, wherein the second rail further includes curved shoulders extending between the lateral base and the outwardly extending flanges to create a channel between the shoulders and the lateral base.

13. The support rail of claim 9, wherein the first end bracket includes a plate having a slot defined along the plate and sized to receive at least one fastener that is secured at one end to the first end of the first rail and positioned at another end through the slot, and the at least one fastener further includes a cap or nut secured around the fastener such that the first end bracket is configured to slide relative to the first end of the first rail along the slot without separating therefrom.

14. The support rail of claim 13, wherein the plate on the first end bracket further includes side edges terminating into lateral projections extending from the plate, each of the lateral projections include along one end thereof one of the pair of first locking flanges.

15. The support rail of claim 14, wherein each of the first locking flanges includes a first inside edge extending from the lateral projection, a first angled edge tapered from the first inside edge and away from the lateral projection, a notch positioned between the first inside edge and the first angled edge, and a second angled edge tapered towards the lateral projection, and wherein the first and second angled edges are configured to allow the first rail to slide and pivot into engagement and settle into a secured positioned with the rack when a portion of the rack rests in the notch.

16. The support rail of claim 13, wherein the plate terminates to a pilot plate angled away from the first end of the first rail, the pilot plate includes the pair of piloting flanges extending therefrom, such that the piloting flanges extend at an angle away from the rear end of the outer rail.

17. The support rail of claim 9, wherein each second locking flange includes an inside face tapering away from the lateral side to a flat edge and further including an outside face tapering towards the lateral side, and further having a notch positioned between the lateral side and the inside face.

18. A support rail for supporting an equipment component on a rack system, the rack system having front and rear racks each with a plurality of openings, the support rail comprising a pair of rails, each rail comprising:
a first rail having an elongated support with a first end and a second end;
a first end bracket slidably attached to the first end of the first rail, the first end bracket includes a pair of first locking flanges extending from the first end bracket and distally positioned from one another to form a first gap there-between, the first end bracket further includes a pair of piloting flanges extending from the first end bracket in the first gap between the pair of first locking flanges, wherein both the pair of first locking flanges and the pair of piloting flanges are configured to slide through the openings in the rack and engage the rack to secure the first end of the first rail thereto and wherein each of the first locking flanges includes a first inside edge extending from a lateral projection, a first angled edge tapered from the first inside edge and away from the lateral projection, a notch positioned between the first inside edge and the first angled edge, and a second angled edge tapered towards the lateral projection, and wherein the first and second angled edges are configured to allow the first rail to slide and pivot into engagement and settle into a secured position with the rack when a portion of the rack rests in the notch; and
a second end bracket secured to the second end of the first rail and configured to engage the rack to secure the second end of the first rail thereto.

19. The support rail of claim 18, wherein the second end bracket includes a plate outwardly extending from the second end bracket to define a second gap between the plate and a face member extending outwardly from an edge of the second end of the first rail, the second end bracket further includes a section pivotally engaging a top plate, the top plate includes lateral sides extending therefrom that terminate into second locking flanges, and wherein the second locking flanges are positioned to slide through openings in the rack and engage the rack to secure the second end of the first rail to the rack, with a portion of the rack sliding into the second gap between the plate and the face member.

20. The support rail of claim 19, wherein the second end bracket includes a second plate secured to the second end of the first rail, and the second plate includes a pair of arms extending upwardly from the section to pivotally engage a pair of second arms extending from the top plate.

21. The support rail of claim 20, wherein the plate includes a magnet positioned to engage a portion of the top plate to maintain the second end bracket in a closed position.

22. The support rail of claim 19, wherein each second locking flange includes an inside face tapering away from the lateral side to a flat edge and further including an outside face tapering towards the lateral side, and further having a notch positioned between the lateral side and the inside face.

23. The support rail of claim 18, wherein the second end bracket having a base plate secured to the second end of the first rail, the base plate having a first pair of arms and a second pair of arms, a top plate having a pair of lateral sides extending therefrom, the lateral sides having a first end and a second end terminating into second locking flanges, and wherein the first pair of arms extend from one portion of the base plate and pivotally engaging the first end of the top plate, and wherein the second pair of arms extend from a second portion of the base plate and engage an interior surface of the lateral sides when the second end bracket is in a closed configuration.

24. The support rail of claim 18, further comprising:
a second rail having a lateral base for alignment with a side of the equipment component, the lateral base having at least one keyhole adapted for use with a corresponding lug extending from the side of the equipment component, the second rail further having flanges extending outwardly from the lateral base.

25. The support rail of claim 24, wherein the elongated support of the first rail further including sides terminating to inwardly curved edges to form edge channels sized to slidably receive the flanges extending from the second rail.

26. The support rail of claim 25, wherein the second rail further includes curved shoulders extending between the lateral base and the outwardly extending flanges to create a channel between the shoulders and the lateral base.

27. The support rail of claim 26, wherein the plate terminates to a pilot plate angled away from the first end of the first rail, the pilot plate includes the pair of piloting flanges extending therefrom, such that the pair of piloting flanges extend at an angle away from the rear end of the first rail.

28. The support rail of claim 18, wherein the first end bracket includes a plate having a slot defined along the plate and sized to receive at least one fastener that is secured at one end to the first end of the first rail and positioned at another end through the slot, and the at least one fastener further includes a cap or nut secured around the fastener such that the first end bracket is configured to slide relative to the first end of the first rail along the slot without separating therefrom.

29. The support rail of claim 18, wherein the first end bracket includes a guide plate secured to the first end of the first rail, the guide plate includes side terminating to inwardly curved edges to form channels, the first end bracket further includes a plate having edges sized to slidably insert into the channels such that the plate is slidably engaged to the first end of the first rail.

30. The support rail of claim 18, wherein the first end bracket further includes a plate, and wherein the plate includes side edges, and wherein each side edge terminates into a lateral projection extending from the plate, each lateral projection includes along one end thereof one of the pair of first locking flanges.

* * * * *